US009753366B2

(12) United States Patent
Dmitriev

(10) Patent No.: US 9,753,366 B2
(45) Date of Patent: Sep. 5, 2017

(54) METHOD AND APPARATUS FOR THE DETERMINATION OF LASER CORRECTING TOOL PARAMETERS

(75) Inventor: Vladimir Dmitriev, Karmiel (IL)

(73) Assignee: Carl Zeiss SMS Ltd., Karmiel (IL)

( * ) Notice: Subject to any disclaimer, the term of this patent is extended or adjusted under 35 U.S.C. 154(b) by 1005 days.

(21) Appl. No.: 13/252,480

(22) Filed: Oct. 4, 2011

(65) Prior Publication Data

US 2012/0084044 A1 Apr. 5, 2012

Related U.S. Application Data

(60) Provisional application No. 61/389,382, filed on Oct. 4, 2010.

(51) Int. Cl.

| G06F 15/00 | (2006.01) |
|---|---|
| G03F 1/60 | (2012.01) |
| B82Y 10/00 | (2011.01) |
| B82Y 40/00 | (2011.01) |
| G03F 1/72 | (2012.01) |

(Continued)

(52) U.S. Cl.
CPC .............. G03F 1/60 (2013.01); B82Y 10/00 (2013.01); B82Y 40/00 (2013.01); G03F 1/72 (2013.01); G03F 7/0002 (2013.01); H01S 3/0014 (2013.01)

(58) Field of Classification Search
CPC . G03F 1/60; G03F 1/72; G03F 7/0002; B82Y 10/00
USPC ....................................................... 702/127
See application file for complete search history.

(56) References Cited

U.S. PATENT DOCUMENTS

| 6,205,818 B1 | 3/2001 | Seward, III |
|---|---|---|
| 6,821,682 B1 | 11/2004 | Stearns et al. |
| 6,834,262 B1 | 12/2004 | Balasinski et al. |

(Continued)

FOREIGN PATENT DOCUMENTS

| DE | 102006054820 | 11/2006 | ............... G03F 7/20 |
|---|---|---|---|
| DE | 102006054821 | 10/2008 | |

(Continued)

OTHER PUBLICATIONS

Sakata Akira, JP2005241782, Google Translation.*

(Continued)

*Primary Examiner* — Michael Nghiem
*Assistant Examiner* — Peter Ngo
(74) *Attorney, Agent, or Firm* — Fish & Richardson P.C.

(57) ABSTRACT

The invention relates to a method for determining at least one unknown laser beam parameter of a laser beam used for correcting errors of a transparent material including inducing a first persistent modification in the material by an interaction with the laser beam having a first set of laser beam parameters, measuring the induced first persistent modification of the material, calculating a second persistent modification in the material using a model describing persistent modifications in the material with a second set of laser beam parameters, wherein the first set of laser beam parameters comprises the second set of laser beam parameters and the at least one unknown laser beam parameter, setting up a target functional including the first persistent modification and the second persistent modification, and determining the at least one unknown laser beam parameter by minimizing the target functional.

12 Claims, 8 Drawing Sheets

(51) Int. Cl.
G03F 7/00 (2006.01)
H01S 3/00 (2006.01)

(56) References Cited

U.S. PATENT DOCUMENTS

| | | | |
|---|---|---|---|
| 6,844,272 | B2 | 1/2005 | Taylor et al. |
| 6,858,537 | B2 | 2/2005 | Brewer |
| 6,883,158 | B1* | 4/2005 | Sandstrom ............ G03F 7/704 430/5 |
| 7,001,697 | B2 | 2/2006 | Park et al. |
| 7,111,277 | B2 | 9/2006 | Ye et al. |
| 7,241,539 | B2 | 7/2007 | Kim et al. |
| 7,352,452 | B2 | 4/2008 | Wegmann et al. |
| 7,459,242 | B2 | 12/2008 | Zait et al. |
| 2006/0007433 | A1 | 1/2006 | Ikuta et al. |
| 2007/0065729 | A1 | 3/2007 | Zait et al. |
| 2007/0224522 | A1 | 9/2007 | Lee et al. |
| 2008/0032206 | A1* | 2/2008 | Lee ..................... G03F 1/144 430/5 |
| 2008/0033206 | A1 | 2/2008 | Harris et al. |
| 2008/0174736 | A1 | 7/2008 | Huang et al. |
| 2010/0010784 | A1 | 1/2010 | Cao et al. |
| 2012/0117522 | A1 | 5/2012 | Feng et al. |

FOREIGN PATENT DOCUMENTS

| | | |
|---|---|---|
| EP | 0 628 806 A2 | 12/1994 |
| EP | 1 647 863 A2 | 4/2006 |
| EP | 1 829 052 B1 | 4/2008 |
| JP | H 11-52550 | 2/1999 |
| JP | 2005241782 | 9/2005 |
| JP | 2006114904 | 4/2006 |
| JP | 2007531249 | 11/2007 |
| JP | 2008506138 | 2/2008 |
| JP | 2010152031 | 7/2010 |
| WO | WO 2005/008333 A2 | 1/2005 |
| WO | WO 2007033362 | 3/2007 |
| WO | WO 2008061510 | 5/2008 |

OTHER PUBLICATIONS

Mulkens Johannes Catharinus, JP2006114904, Google translation.*
Pforr Rainer, DE 102006054820, Google Translation.*
Allen et al., "An ion figuring system for large optics fabrication", Proc. SPIE 1168, p. 33-50 (1989).
Ams et al., "Investigation of Ultrafast Laser-Photonic Material Interactions: Challenges for Directly Written Glass Photonics", *IEEE Journal of Selected Topics in Quantum Electronics*, vol. 14, No. 5, pp. 1370-1381 (Sep./Oct. 2008).
Bechtold et al., "Non-thermal Micro Adjustment Using Ultrashort Laser Pulses", *Journal of Laser Micro/Nanoengineering*, vol. 2, No. 3, pp. 183-188 (2007).
Bender et al., "Computer-controlled belt polishing of diamond-turned annular mirrors" Reprinted from Advances in Fabrication and Metrology for Optics and Large Optics, Proc. SPIE vol. 966, pp. 29-38 (1988).
Burge, "Simulation and optimization for a computer-controlled large-tool polisher", vol. XXIV, Optical Society of America, Washington D.C., pp. 165-168 (1999).
Efimov et al., "Color center generation in silicate glasses exposed in infrared femtosecond pulses", J. Opt. Soc. Am., vol. 15, p. 193-199 (1998).
Frost et al., "Large area smoothing of optical surfaces by low-energy ion beams", Thin Solid Films 459, p. 100-105 (2004).
Glezer et al., "3-D Optical Storage Inside Transparent Materials", *Optics Letters*, vol. 21, No. 24, pp. 2023-2025 (1996).
Hoskins, "Aspheric surface figuring of fused silica plasma assisted chemical etching", SPIE vol. 2542, Optomechanical and Precision Instrument Design, p. 220-230 (1995).
R.A. Jones, Ed., "Selected Papers on Computer-Controlled Optical Surfacing," vol. MS40, SPIE Press, Bellingham, WA (1991).
Martin et al., "Fabrication of 6.5 m f/1.25 Mirrors for the MMT and Magellan Telescopes", vol. XXIV, Optical Society of America, Washington D.C., pp. 187-192 (1999).
Oshemkov et al., "DIV Attenuating Structures in fused silica induced by ultrafast laser radiation", *Proc. CLEOE-IQEC*, Munich 2007).
Reimer, "Scanning Electron Microscopy: Physics of Image Formation and Microanalysis (Springer Series in 1 Optical Sciences)", 2nd (second) completely rev edition by Reimer, Ludwig published by Springer (1998), pp. 101-106; 138-142; and 148-152.
Shimotsuma et al., "Nano-modification inside transparent materials by femtosecond pulse laser", Mod. Phys. Lett. B, vol. 19, No. 5, p. 225-238, (2005).
Shimotsuma et al., "Self-Organized Nanogratings in Glass Irradiated by Ultrashort Light Pulses", *Physical Review Letters*, vol. 91, No. 24, pp. 247405-1-247405-4 (Dec. 12, 2003).
Skuja et al., "Laser-induced color centers in silica", *SPIE*, vol. 4347, pp. 155-168 (2001).
Streltsov et al., "Fabrication and analysis of a directional coupler written in glass by nanojoule femtosecond laser pulses", *Optics Letters*, vol. 26, No. 1, pp. 42-43 (Jan. 1, 2001).
Taylor et al., "Specification, Fabrication, Testing, and Mounting of EUVL Optical Substrates", *EUV Lithograpy, SPIE Press Monograph*, vol. PM178, pp. 161-185 (2008).
Taylor et al., "Femtosecond laser erasing and rewriting of self-organized planar nanocracks in fused silica glass", *Optics Letters*, vol. 32, No. 19, pp. 2888-2890 (Oct. 1, 2007).
U.S. Appl. No. 61/324,467, filed Apr. 15, 2010.
U.S. Appl. No. 61/351,056, filed Jun. 3, 2010.
U.S. Appl. No. 61/363,352, filed Jul. 12, 2010.

* cited by examiner

METHOD AND APPARATUS FOR THE DETERMINATION OF LASER CORRECTING TOOL PARAMETERS

CROSS REFERENCE TO RELATED APPLICATIONS

Pursuant to 35 U.S.C. §119, this application claims the benefit of U.S. provisional application 61/389,382, filed on Oct. 4, 2010, which is herein incorporated by reference.

FIELD OF THE INVENTION

The present invention relates to the field of the determination of laser correcting tool parameters.

BACKGROUND OF THE INVENTION

As a result of the constantly increasing integration density in the semiconductor industry, photolithographic masks or templates of the nanoimprint lithography have to project smaller and smaller structures onto a photosensitive layer, i.e., a photoresist dispensed on wafers. In order to fulfil this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex, and thus more and more expensive as well. In the future, photolithographic masks will use significantly smaller wavelengths in the extreme ultraviolet (EUV) wavelength range of the electromagnetic spectrum (approximately 13.5 nm).

Photolithographic masks have to fulfil highest demands with respect to transmission homogeneity, planarity, pureness and temperature stability. In order to fabricate photolithographic masks with a reasonable yield, defects or errors of masks have to be corrected at the end of the manufacturing process. Various types of errors of photolithographic masks and methods for their corrections are described in the U.S. provisional applications U.S. 61/324,467, U.S. 61/351,056 and U.S. 61/363,352, which are herein incorporated by reference in their entirety. A new type of lithography is the nanoimprint technique in which pattern elements are transferred via a polymer layer to an underlying wafer. Since the reproduction scale of pattern elements in a template for the nanoimprint lithography is 1:1, high demands are made to a template with respect to admissible errors. Thus, defective templates also have to be corrected whenever possible.

Femtosecond light pulses of a laser source can be used to correct errors of photolithographic masks and templates for the nanoimprint lithography. For this purpose, the laser source applies a huge local energy density on the transparent material of a substrate of a photolithographic mask or of a template which leads to a local melting of the transparent material. This local melting induces a local variation of the density of the substrate or of the template material. A local density variation is in the following also called a pixel. The introduction of a local density variation by locally applying the laser beam on the material is in the following denoted as the writing of pixels in the transparent material.

The generation of pixels in a transparent material by high intensity femtosecond light pulses induces a local nonlinear optical process at the interaction zone of the photons of the light pulses with the electrons of the material. The introduction of a plurality of pixels in the transparent material results in locally varying displacements of pattern elements arranged on a surface of the transparent material. Moreover, the writing of pixels in a transparent material leads to a second effect in the material as the pixels locally modify the optical transmission of the transparent material.

The document DE 10 2006 054 820 A1 phenomenologically describes the effects of introducing a local density variation in a substrate of a photolithographic mask on the optical transmission of the substrate and of the displacement of pattern elements arranged on the surface of the substrate. The parameters used to differently influence the optical absorption and the displacement of pattern elements are the pixel size and the pixel density. The pixel size is a function of the absorbed optical dose, i.e., of the number of photons locally applied to the material. For the correction of errors of photolithographic masks, the above mentioned document proposes to set-up a library for the arrangements of pixels used for desired corrections of displacement errors.

Thus, the approach of DE 10 2006 054 820 A1 allows to correct some of the errors of photolithographic masks. However, this approach requires some efforts. It is a major drawback of the discussed approach that it does not provide a quantitative description between the effects caused by the laser beam in the transparent material and the parameters of the laser beam used for the error correction.

It is therefore one object of the present invention to provide a method and an apparatus for determining parameters of a laser beam used for the correction of errors of a transparent material.

SUMMARY OF THE INVENTION

According to a first aspect of the invention, a method for determining at least one unknown laser beam parameter of a laser beam used for correcting errors of a transparent material is provided. The method comprises inducing a first persistent modification in the material by an interaction with the laser beam having a first set of laser beam parameters, measuring the induced first persistent modification of the material, calculating a second persistent modification in the material using a model describing persistent modifications in the material with a second set of laser beam parameters, wherein the first set of laser beam parameters comprises the second set of laser beam parameters and the at least one unknown laser beam parameter, setting up a target functional comprising the first persistent modification and the second persistent modification, and determining the at least one unknown laser beam parameter by minimizing the target functional.

The deformation model using the second set of laser beam parameters and the at least one determined laser beam parameter essentially exactly simulates the induced persistent modification. Therefore, the determination of the complete set of laser beam parameters allows directly correcting measured errors of a transparent material. In more detail, the deformation model enables the calculation of the required arrangement of pixels in the transparent material in order to correct a specific defect. Thus, the laser beam may be controlled to exactly correct measured individual errors of the transparent material. The deformation model describes both types of errors, placement errors or registration changes and optical transmission errors. Consequently, the laser beam can individually be designed for each type of error, so that the arrangement of the pixels introduced or written in the transparent material with this laser beam does not introduce errors of another type.

Therefore, the application of the defined method for the determination of laser beam parameters will increase the yield of a photolithographic mask fabrication process or of the manufacturing process of templates for the nanoimprint lithography.

According to a further aspect, the transparent material comprises a substrate of a transmissive and/or a reflective photolithographic mask. In an alternative aspect, the transparent material comprises a template for a nanoimprint lithography.

In still another aspect, a Lagrange variational principle is used to set-up the target functional. In a further aspect, the target functional minimizes a difference between the first persistent modification and the second persistent modification calculated by using the Lagrange variational principle.

The application of a Lagrange variation principle allows connecting the persistent variation in the transparent material with the parameters of the laser beam inducing the persistent variation, thus enabling the determination of the laser beam parameters also for the extreme conditions in the focal point of femtosecond laser pulses.

In another aspect, the first persistent modification is induced in a portion of the material and the induced first persistent modification is measured across an overall area of the material and wherein the second persistent modification is calculated across the overall area.

By just using a part of a substrate of a photolithographic mask for the determination of the at least one unknown laser parameter, the substrate or the photolithographic mask can be applied several times, thus reducing the cost for this process.

The second set of laser beam parameters may comprise a pulse energy, a pulse length, a repetition rate, a number of pulses directed onto one location of the material, a distance between two locations the laser beam is directed onto the material, a numerical aperture, and a focus size.

In another aspect, the second set of laser beam parameters determines a writing density amplitude and a writing density which are model parameters. The two model parameters writing density amplitude and writing density provide a connection to the laser beam parameters listed in the preceding paragraph.

In a further aspect, the at least one unknown laser beam parameter comprises components of a deformation element in the material in a normal direction perpendicular to the laser beam.

This model parameter accounts for deviations of the laser beam from predetermined numerical values in the focal point of the laser beam. For example some of the first set of laser beam parameters depend on a deviation of the laser beam from an ideal Gaussian shape. The writing of pixels into the transparent material can not be completely controlled by the laser beam parameters. These parameters may be the subject of temporal and/or temperature variations and/or fluctuations. Further, the laser beam may be influenced by the humidity and/or the age of the system components. Moreover, native or quantum fluctuations may have influence on the intensity distribution of the laser beam in its focal point.

According to a further aspect, the writing density amplitude and the writing density are constant across the transparent material during determining the at least one laser beam parameter. This requirement facilitates the determination of the at least one unknown parameter.

In still another aspect, a displacement of a node of a rectangular grid extending across the material is a function of the first set of laser beam parameters.

In a further aspect, the persistent modification comprises a density variation of the material.

According to another aspect, one set m of the second set of laser beam parameters results in a calculated displacement $\zeta_i$ at the location i as a function of the components of the deformation element $t_l^m$ in at least one normal direction l which is given by $$\zeta_i = \sum_l R_{il} t_l^m,$$

where $R_{ij}$ is $$R_{il} = \sum_{njk} M_{in}(P_{nj}^g)^{-1} P_{jk}^w a_m N_{kl},$$

wherein the tensor $(P_{nj}^g)^{-1}$ is the inverse tensor of a potential energy distribution in an initial state of the material and $P_{jk}^w$ is an element of the tensor describing the potential energy distribution after introducing the first density variation in the material, both tensors comprise material parameters of the material, and $N_{kl}$ is a normalization tensor.

This equation connects the second laser beam parameters of the laser beam with their effects on the transparent material. This means that the deformation model uses material parameters and basic physical laws in order to determine the effects of femtosecond light pulses of the laser beam induced in the transparent material of a photolithographic mask or of a template for the nanoimprint lithography.

In still a further aspect, the induced first persistent modification is a density variation measured as a difference of a displacement $\phi_n$ of a location n relative to the location n prior to inducing the first persistent modification.

According to another aspect, the target functional is of the form $$\min\left\{\sum_n (\varphi_n - \zeta_n)^2\right\}.$$

In an alternative aspect, the persistent modification comprises a density variation of the material and the induced variation of the refraction index in the material is used for determining of the at least one laser beam parameter.

According to still a further aspect, one set m of laser beam parameters results in a calculated retardation $\rho_n$ at the location n as a function of the components of the deformation element $t_l^m$ in at least one normal direction l, which is given by $$\rho_n = d \cdot n_0^3 \sum_{ijrpokl} M_{nr} d_{rq} q_{pq} H_{po} A_{oi} (P_{ij}^g)^{-1} P_{jk}^w a_m N_k^l t_l^m$$

where d is the thickness of the material, $n_o$ is the refraction index, $M_{nr}$ denotes a transform matrix which transforms the retardations at the grid nodes to a retardation $\rho_n$ at an arbitrary location n, $d_{rq}$ is the direct product of the matrix $$d = \begin{Bmatrix} 1 & -1 & 0 \\ 0 & 0 & 1 \end{Bmatrix}$$

with a unity matrix having a dimension of $(2 \cdot (M+1)^2)*(2 \cdot (M+1)^2)$, $q_{qp}$ stands for the direct product of the optic stress matrix in a two-dimensional approximation with a unity matrix having a dimension of $(2 \cdot (M+1)^2)*(2 \cdot (M+1)^2)$, $H_{po}$ is the direct product of the elasticity tensor in a two-dimensional approximation with a unity matrix having a dimension of $(2 \cdot (M+1)^2)*(2 \cdot (M+1)^2)$, the matrix operator $A_{oi}$ describes the partial derivatives of the two-dimensional displacement field, the tensor $(P_{nj}{}^g)^{-1}$ is the inverse tensor of a potential energy distribution in an initial state of the material and $P_{jk}{}^w$ is an element of the tensor describing the potential energy distribution after introducing the first density variation in the material, both tensors comprise material parameters of the transparent material, and $N_{kl}$ is a normalization tensor.

In a further aspect, the induced retardation variation is measured as a difference between the retardation $\theta_n$ of a location n prior to inducing the first persistent modification and after inducing the first persistent modification with the first set of the laser beam parameters.

According to another aspect, the target functional is of the form $$\min \left\{ \sum_n (\theta_n - \rho_n)^2 \right\}.$$

In a further aspect, a method for determining at least one unknown laser beam parameter of a laser beam used for correcting registration errors of a photolithographic mask comprises measuring the registration errors, determining a persistent modification in the photolithographic mask correcting the registration errors using a model describing persistent modifications in the photolithographic mask, correcting the registration errors by inducing the persistent modification in the photolithographic mask using an interaction with the laser beam, measuring remaining registration errors, and determining the at least one unknown laser beam parameter from the remaining registration errors.

This aspect of the inventive principle is beneficial in that it does not require additional measurements in order to determine the at least one unknown laser beam parameter. In order to be able to correct registration errors, they have to be known, and thus they have to be measured. After the error correction is performed, it is at least from time to time necessary to control the success of the error correction process by measuring the remaining registration errors. These measurements in combination with the calculation of the persistent modification in the photolithographic mask can simultaneously be used to determine the at least one unknown laser beam parameter with minimum additional effort.

In a further aspect, a first set of laser beam parameters are determined from the remaining registration errors. According to still a further aspect, determining the persistent modification comprises determining a second set of laser beam parameters, wherein the first set of laser beam parameters comprises the second set of laser beam parameters and the at least one unknown laser beam parameter. In yet another aspect, determining the at least one unknown laser beam parameter comprises setting up a target functional, varying of the unknown laser beam parameter, computing of the remaining registration errors and minimizing the target functional.

Finally, in still another aspect, an apparatus for determining at least one unknown laser beam parameter of a laser beam used for correcting errors of a transparent material comprises at least one laser source for generating the laser beam of light pulses according to a first set of laser beam parameters, at least one measuring means adapted for measuring a first persistent modification induced in the material by the light pulses of the at least one laser source, at least one computing means operable for calculating a second modification in the material using a model describing persistent modifications in the material with a second set of laser beam parameters, wherein the first set of laser beam parameters comprises the second set of laser beam parameters and the at least one unknown laser beam parameter, and wherein the at least one computing means is further operable for minimizing a target functional comprising the first persistent modification and the second persistent modification to determine the at least one unknown laser beam parameter.

DESCRIPTION OF THE DRAWINGS

In order to better understand the present invention and to appreciate its practical applications, the following Figures are provided and referenced hereafter. It should be noted that the Figures are given as examples only and in no way limit the scope of the invention.

DETAILED DESCRIPTION

This part of the specification refers to part 6 entitled "theoretical background" of the U.S. provisional application U.S. 61/363,352. Equations of this part are used in this application without further explanation. Some of the problems of photolithographic masks and of templates for the nanoimprint lithography are also briefly discussed in the above mentioned document.

This section begins with a brief description of the apparatus used for the correction of deficits of transparent materials. In the second part, two alternative approaches are presented to determine the at least one unknown laser beam parameter.

In the following, the present invention will be more fully described hereinafter with reference to the accompanying Figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

Figure 1:
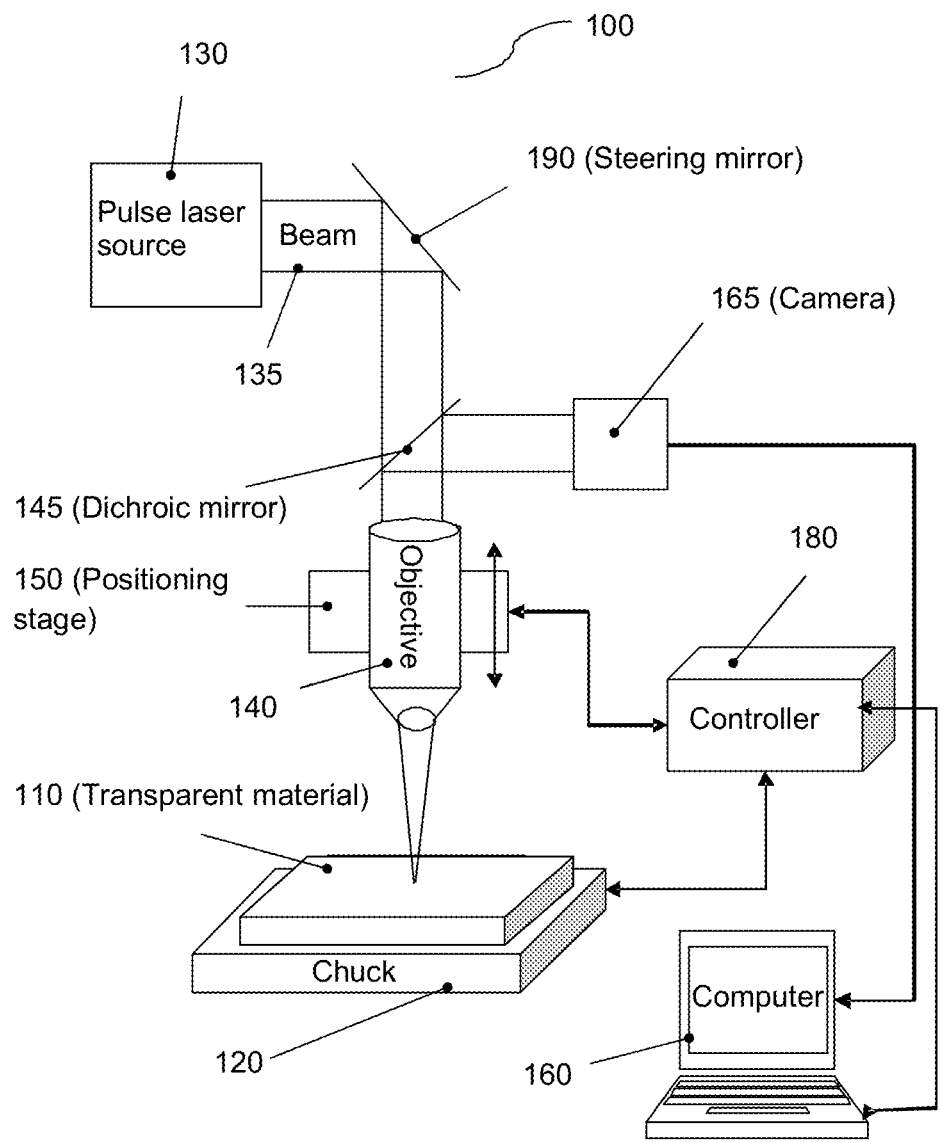
FIG. 1 schematically represents a block diagram of an apparatus used for inducing persistent modifications in the transparent material and for measuring the induced persistent modifications in the transparent material.

FIG. 1 depicts a schematic block diagram of an apparatus 100 which can be used to correct errors of photolithographic masks as well as of templates for the nanoimprint lithography. The apparatus 100 comprises a chuck 120 which may be movable in three dimensions. The transparent material 110 may be fixed to the chuck 120 by using various techniques, for example, clamping.

The apparatus 100 includes a pulse laser source 130 which produces a beam or a light beam 135 of pulses or light pulses. The laser source 130 generates light pulses of variable duration. The adjustable range of several import parameters of the laser source 130 is summarized in the following table. Table 1 represents an overview of laser beam parameters of a frequency-doubled Nd-YAG laser system which can be used in an embodiment of the inventive method.

TABLE 1

Numerical values of selected laser beam parameters for a Nd-YAG laser system
Overview

| Parameter | Numerical value | Unit |
|---|---|---|
| Pulse energy | 0.05-5 | µJ |
| Pulse length | 0.05-100 | Ps |
| Repetition rate | 1-10 000 | KHz |
| Pulse density | 1 000-10 000 000 | mm$^{-2}$ |
| NA (numerical aperture) | 0.1-0.9 | |
| Wavelength | 532 | Nm |

In an alternative embodiment the light pulses may be generated by a Ti:Sapphire laser operating at a wavelength of 800 nm. However, the various aspects of the inventive method described in the following are not limited to these laser types, principally all laser types may be used having a photon energy which is smaller than the band gap of the transparent material 110 and which are able to generate pulses with durations in the femtosecond range. The term "transparent material" means in the context of this application that at least a portion of the photons of a light beam can pass the transparent material.

The steering mirror 190 directs the pulsed laser beam 135 into the focusing objective 140. The objective 140 focuses the pulsed laser beam 135 onto the transparent material 110. The NA (numerical aperture) of the applied objectives depends on the predetermined spot size of the focal point and the position of the focal point within the transparent material 110. As indicated in table 1, the NA of the objective 140 may be up to 0.9 which results in a focal point spot diameter of essentially 1 µm and a maximum intensity of essentially $10^{20}$ W/cm$^2$.

The apparatus 100 also includes a controller 180 and a computer 160 which manage the translations of the two-axis positioning stage of the sample holder 120 in the plane perpendicular to the laser beam (x and y directions). The controller 180 and the computer 160 also control the translation of the objective 140 perpendicular to the plane of the chuck 120 (z direction) via the one-axis positioning stage 150 to which the objective 140 is fixed. It should be noted that in other embodiments of the apparatus 100 the chuck 120 may be equipped with a three-axis positioning system in order to move the transparent material 110 to the target location and the objective 140 may be fixed, or the chuck 120 may be fixed and the objective 140 may be moveable in three dimensions. Although not economical, it is also conceivable to equip both the objective 140 and the chuck 120 with three-axis positioning systems. It should be noted that manual positioning stages can also be used for the movement of the transparent material 110 to the target location of the pulsed laser beam 135 in x, y and z directions and/or the objective 140 may have manual positioning stages for a movement in three dimensions.

The computer 160 may be a microprocessor, a general purpose processor, a special purpose processor, a CPU (central processing unit), a GPU (graphic processing unit), or the like. It may be arranged in the controller 180, or may be a separate unit such as a PC (personal computer), a workstation, a mainframe, etc. The computer 160 may further comprise I/O (input/output) units like a keyboard, a touchpad, a mouse, a video/graphic display, a printer, etc. In addition, the computer 160 may also comprise a volatile and/or a non-volatile memory. The computer 160 may be realized in hardware, software, firmware, or any combination thereof. Moreover, the computer 160 may control the laser source 130 (not indicated in FIG. 1).

Further, the apparatus 100 may also provide a viewing system including a CCD (charge-coupled device) camera 165 which receives light from an illumination source arranged to the chuck 120 via the dichroic mirror 145. The viewing system facilitates navigation of the transparent material 110 to the target position. Further, the viewing system may also be used to observe the formation of a modified area on the transparent material 110 by the pulsed laser beam 135 of the light source 130.

In the following, a first example for performing the inventive method is presented. As already mentioned, the deformation model which describes displacement changes induced by femtosecond light pulses is presented in the U.S. 61/363,352. A displacement change or a registration change induced by the writing of pixels in the transparent material 110 can be represented by a linear operator operating in spaces of the writing density amplitudes $a_m^\alpha$ and components of the deformation element in normal directions $t_j^m$ having values in the space of the induced node displacements $\xi_i$ (cf. equation 31 of the U.S. 61/363,352):

$$\xi_i = \sum_{j=1,k=1,\alpha=1,l=1,m=1}^{2\cdot(M+1)^2,8,M^2,5,R} (P_{ij}^g)^{-1} P_{jk\alpha}^w a_m^\alpha N_{kl} t_l^m \qquad (1)$$

The displacements $\xi_i$ of the rectangular grid nodes i are counted in pairs x,y from left to right and from bottom to top. The index m denotes one specific set of the laser beam parameters, or one of the different writing modes of the laser beam (m=1, . . . , R). The index k denotes eight components which transform the deformation property of the laser beam $e_k$ in a deformation of a rectangular area in a plane perpendicular to the laser beam, thus: (k=1, . . . , 8); whereas the index l accounts for the independent components of $t_l^m$. The deformation element in normal directions has eight components (k=1, . . . , 8), but only five independent ones, i.e. (l=1, . . . , 5). The index $\alpha$ identifies one of the rectangular elementary areas into which the transparent material 110 is divided ($\alpha$=1, . . . , $M^2$). Finally, the index j denotes the number of corners or of grid notes of the $M^2$ rectangular elementary areas and thus: $1 \leq j \leq (M+1)^2$.

The parameter $t_l^m$ can be called a tool signature for the $m^{th}$ set of laser beam parameter or for the writing mode m, since $t_l^m$ is specific for a particular laser system. In the following, the parameter $t_l^m$ will be called mode signature as it normally also depends on the specific writing mode of a laser system.

The registration change is measured for a set of locations $X_j, Y_j$, with j=1, . . . , L. As discussed in the part "theoretical background" of the U.S. 61/363,352, the deformation induced by the laser beam in the transparent material is in the presented approximation additive to all initial registration problems.

Equation 1 determines the displacements only at the nodes i. The assumption of a linear behaviour of the deformation inside the elementary areas of the rectangular grid allows the generation of a matrix $M_{ij}$, which transforms the magnitudes of the displacements $\xi_i$ in the nodes i to the magnitude at a desired location $\zeta_i$ using equation 32 of the above mentioned document:

$$\zeta_i = \sum_{j=1}^{2\cdot(M+1)(M+1)} M_{ij} \xi_j \qquad (2)$$

The displacement $\zeta_i$ is a result of a linear interpolation of simulated displacements at the locations $X_j, Y_j$. The matrix $M_{ij}$ has a dimension of L×2*M*M, but has actually only 8 diagonal elements because every location $\zeta_i$ is interpolated using only four corners of the respective element. The combination of equation 1 and equation 2 results in:

$$\zeta_n = \sum_{i=1,j=1,k=1,\alpha=1,l=1,m=1}^{2\cdot(M+1)^2,2\cdot(M+1)^2,8,M^2,5,R} M_{ni}(P_{ij}^g)^{-1} P_{jk\alpha}^w a_m^\alpha N_{kl} t_l^m \qquad (3)$$

The inventive method defines the at least one unknown parameter, which are the components l of the mode signature $t_l^m$ for the writing mode m, by performing a test writing, which introduces a persistent modification into the transparent material 110, and by measuring the induced registration change. It will now be demonstrated how a simple experiment can be designed which defines the components of one set m of laser beam parameters or one writing mode m. This measurement will be called calibration experiment. By the repetition of this calibration experiment for each writing mode m, the signatures $t_l^m$ for each writing mode m can be determined.

A test mask will now be taken which is representative for a set of registration targets. The test mask can for example be a photolithographic mask rejected at the final test of the manufacturing process, but having registration marks. Alternatively, pattern elements arranged on the substrate of the photolithographic mask can also be used for registration measurements. The process begins by measuring the initial state of the registration before the calibration experiment is performed. In the second step, pixels are written in the transparent material. The pixels are only written in a portion of the photolithographic mask, because this is enough for the definition of the mode signature. This approach accelerates the calibration experiment, and, on the other hand, saves substrate area of the photolithographic mask for further calibration experiments. To keep the process simple, a single set of laser beam parameters or a single writing mode m is used for inducing first persistent modifications in the portion of the mask. In order to improve the accuracy of the calibration experiment, the pixels are written according to a regular grid, and the writing density is kept constant in every cell of the portion of the photolithographic mask. For simplicity reasons, it is also possible to choose a single constant writing density amplitude for mode m across the portion of the mask. These conditions do not affect the computation complexity, but only simplify the writing process. This means that in equation 3 all components of the writing density amplitude $a_m^\alpha$ are known, and the resulting registration change of equation 3 can be represented as:

$$\zeta_n = \sum_{l=1}^{5} R_{nl} t_l^m \qquad (4)$$

The measured registration change is denoted as $\phi_n$. The components of the mode signature $t_l^m$, which give the best match with the change $\zeta_n$ computed with the deformation model with respect to the measured registration change $\phi_n$, are given by:

$$\min\left\{\sum_{n=1}^{N} (\varphi_n - \zeta_n)^2\right\} \qquad (5)$$

where N has to be larger than the number of the components of $t_l^m$, i.e., it has to fulfil the constraint N>5.

It is not necessary to regularize the target functional. The best matching solution for the mode signature can be expressed as:

$$t^m = (R^T R)^{-1} R^T \phi \qquad (6)$$

where $R^T$ is the transposed matrix R and $R^{-1}$ denotes the inverse matrix R.

Figure 2:
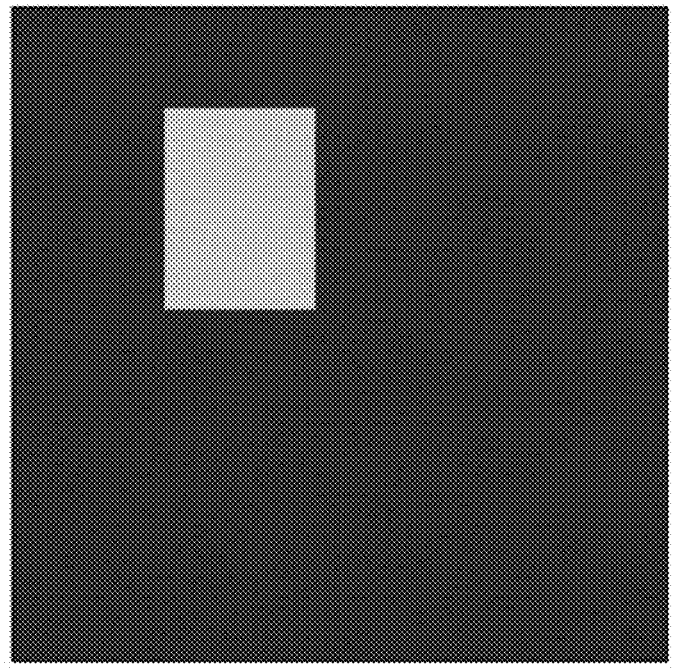
FIG. 2 shows a test mask for a calibration experiment, in the grey area pixels are induced with constant writing density.

In the following, the effectiveness of the discussed approach of a calibration experiment will be demonstrated. FIG. 2 shows a test mask in which a quarter of the active area of the test mask has been used for the writing of pixels for the calibration experiment. The grey area shows the constant writing density as discussed above. The overall area of the substrate of the photolithographic mask was 152 mm×152 mm and the selected portion of the mask substrate has dimensions of 35 mm×47 mm. With this selection of the writing map, i.e. the portion of the mask substrate into which the laser beam 135 induces or writes pixels, a mask can be used for four calibration experiments when pixels are written into a single writing layer. The use of several different writing layers in different depths in the transparent material correspondingly multiplies the application of the transparent material, for example a substrate of a photolithographic mask, for calibration experiments. The writing of pixels in different depths of the transparent material should be limited to a range around the centre of the mask depth. In case pixels are written close to a surface of the mask substrate, the mask substrate may start bending which reduces the accuracy of the used 2D (two-dimensional) approximation. A bending effect can be taken into account by using a 3D (three-dimensional) model similar to the 2D variant described in this application. However, a bending of the mask substrate is detrimental to the application as it may introduce image defects in the photoresist on a wafer.

Figure 3:
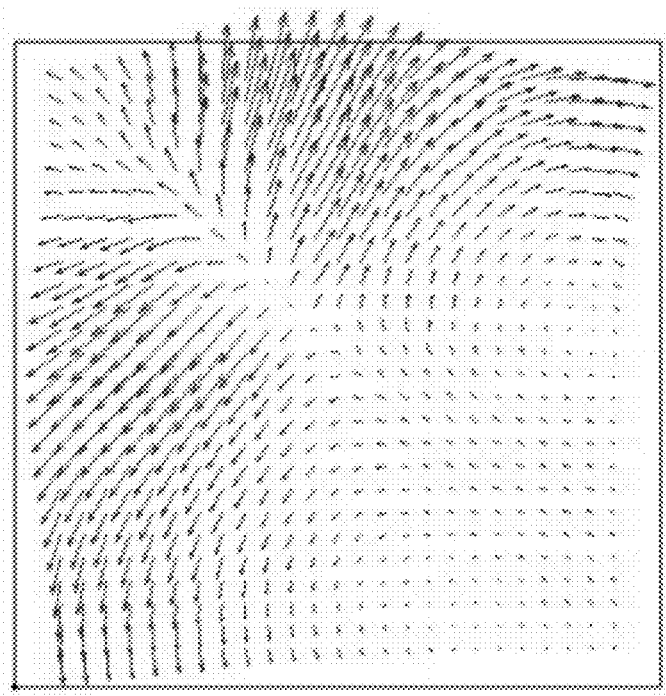
FIG. 3 represents the registration changes induced by the calibration experiment of FIG. 2.

FIG. 3 presents the resulting measured change of the induced registration. In this Figure and in the following ones the direction of the arrows indicates the direction into which a registration is shifted caused by the pixels written by the calibration experiment of FIG. 2 in the portion of the transparent material. The lengths of the arrows indicate the amount of the shift at the respective position on the photolithographic mask. It is noticed that most of the registration change is demonstrating an expansion of the area processed with femtosecond laser pulses of the laser source 130.

Figure 4:
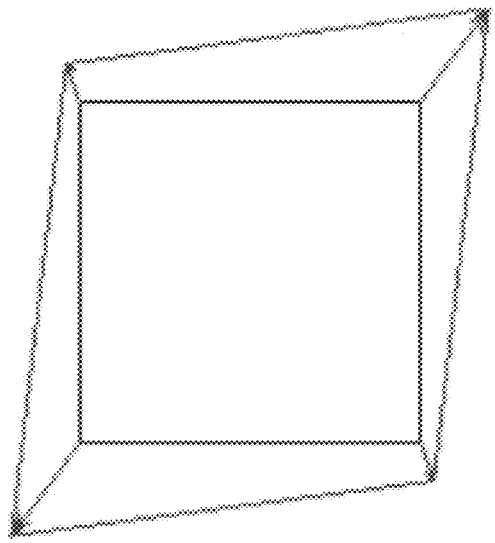
FIG. 4 schematically depicts the computed components values of the mode signature $t_l{}^m$.

The components/of the mode signature $t'^m_i$ for the writing mode m are obtained from equation 6 and are depicted in FIG. 4. The black square shows an undisturbed or a non-deformed elementary area or a cell in the plane of the induced pixels within the transparent material prior to the writing of pixels. The red rhomboid presents the deformed elementary area after performing the calibration experiment of FIG. 2. The area of the red rhomboid is clearly larger than the area of the black square; this indicates that the writing of the pixels induces a local reduction of the density of the transparent material. The asymmetry in the red rhomboid compared with the black square reflects the asymmetry of the expansion induced by the laser beam in its focal point.

FIG. 4 graphically presents the computed numerical values of the components of the mode signature. For the construction of the red rhomboid the determined values $t'^m_i$ are taken and linear combinations according to $$\sum_{j=1}^{5} N_{ij} t'^m_j$$

(multiplied with some constants) are added to the coordinates of the corners of the non-deformed cell. The construction of the red rhomboid comprises three independent components which are transformed in a set of nodes displacements using the matrix $N_{ij}$.

Figure 5:
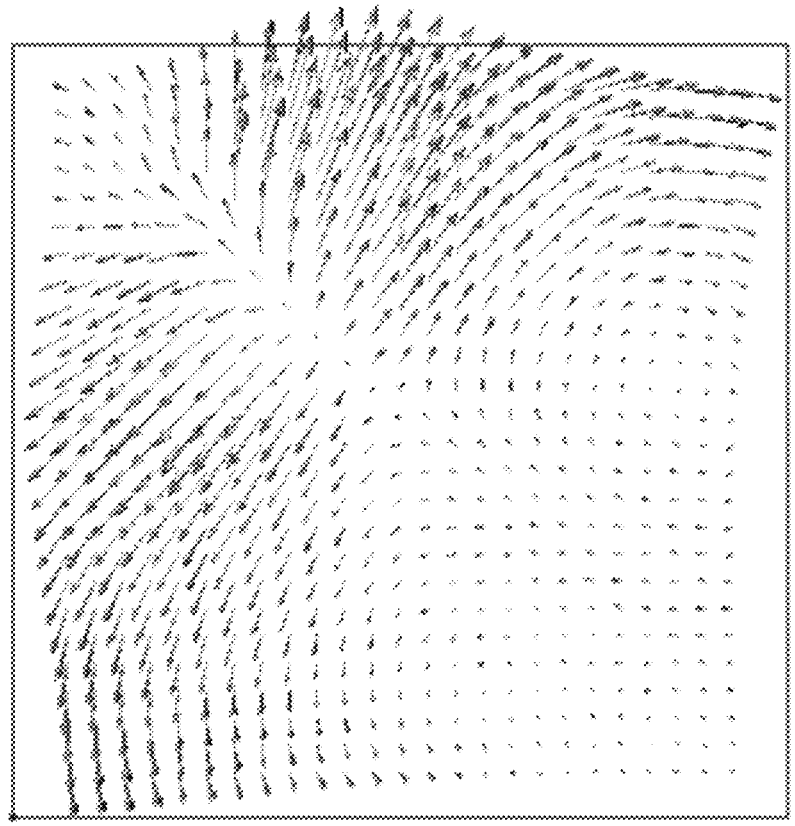
FIG. 5 shows measured (grey) and simulated (black) registration changes according to the writing map of FIG. 2.

In order to estimate the accuracy of the determined mode signature, equation 3 is used to calculate or to simulate the registration change using the determined component values of the mode signature $t'^m_i$. FIG. 5 shows in one diagram the measured (grey) and computed (black) registration changes of the writing map of FIG. 2.

Figure 6:
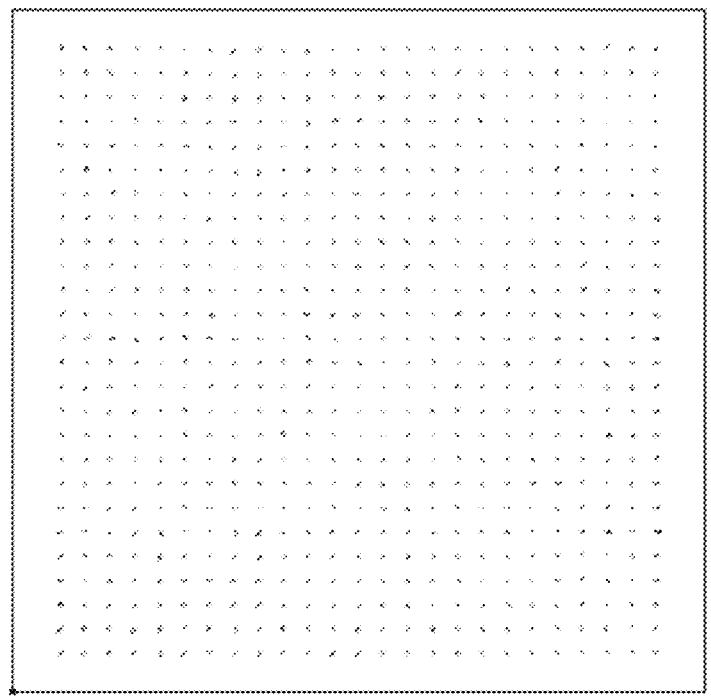
FIG. 6 depicts differences of measured (FIG. 3) and simulated registration changes (FIG. 5) for the writing map of FIG. 2.

FIG. 6 represents the residual registration change when the calculated registration changes are subtracted from the measured displacements. It is clearly seen from FIG. 6 that the differences do not contain any systematic error. The remaining differences are most likely resulting from the measurement noise and from the instability of the apparatus 100 used as the writing tool in the calibration experiment of FIG. 2.

The mean square difference between the measured and simulated registration change is 0.38 nm and $R^2=0.995$ which clearly demonstrates the very high certainty of the mode signature determination.

Due to the fact that the tool signature does not significantly depend on the writing depth and as a consequence of the good additivity of the induced registration changes, it is possible to utilize the same photolithographic mask for another series of calibration experiments. The calibration pixels are written in an adjacent layer, wherein the different layers are separated in the direction of the laser beam by a distance which is larger than the size of the pixel in the beam direction.

In the following, a second example for performing the inventive method is presented. Only the part of the mathematical formalism of the deformation model which is not covered by the U.S. 61/363,352 will be discussed here.

For a known displacement field u(x,y), the two-dimensional (2D) infinitesimal strain tensor can be presented as:

$$\varepsilon_{ik} = \frac{1}{2}\left(\frac{\partial u_i}{\partial x_k} + \frac{\partial u_k}{\partial x_i}\right) \qquad (7)$$

where $u_0(x,y)=\Delta x(x,y)$, $u_1(x,y)=\Delta y(x,y)$, $x_0=x$, $x_1=y$. In an engineering notation using Cauchy's formulas the strain tensor can be written as (cf. equation 5 of the U.S. 61/363,352):

$$\varepsilon(x, y) = Au(x, y) \qquad (8)$$

with $$A = \begin{bmatrix} \partial/\partial x & 0 \\ 0 & \partial/\partial y \\ \partial/\partial y & \partial/\partial x \end{bmatrix} \qquad (9)$$

As already discussed above, the equation 1 is valid for the case that the assumption of a linear behaviour of the displacement field u(x,y) of equation 7 between the various grid nodes is valid. Using a linear assumption, the derivatives of equation 7 at the grid nodes are of the form:

$$\partial u_i^k/\partial x_0 = (\xi_{2k+i+1} - \xi_{2k+i-1})/2m$$

$$\partial u_i^k/\partial x_1 = (\xi_{2k+i+M} - \xi_{2k+i-M})/2m \qquad (10)$$

When again using a linear assumption, the strain tensor inside a cell can also be expressed in the way in which intra cell displacements have been expressed (cf. equation 14 of the U.S. 61/363,352).

The writing of pixels into the transparent material, which introduces a local variation of the density of the transparent material, also induces changes of the electric properties of the transparent material. It is known that the induced change of the impermeability $\Delta\beta_{ij}$ linearly depends on the induced stress, wherein the impermeability $\beta$ and the permittivity $\epsilon$ are linked by $$\varepsilon = \frac{1}{\beta}.$$

This dependence can be expressed with the aid of the components of the stress optic matrix:

$$\Delta\beta_{ij} = \sum_{k=1,l=1}^{3,3} q_{ijkl}\sigma_{kl} \quad (11)$$

In the general case, the stress optic matrix $q_{ijkl}$ has 81 components. By considering the symmetry of the permittivity tensor and of the stress tensor, it is found that only 36 of the 81 components are independent. By using an engineering notation (Voigt's notation) equation 11 can be rewritten as:

$$\Delta\beta_i = \sum_{j=1}^{6} q_{ij}\sigma_j \quad (12)$$

For an isotropic material only two components of the stress optic matrix are independent and the matrix $q_{ijkl}$ in equation 11 can be represented as:

$$\begin{vmatrix} q_1 & q_2 & q_2 & 0 & 0 & 0 \\ q_2 & q_1 & q_2 & 0 & 0 & 0 \\ q_2 & q_2 & q_1 & 0 & 0 & 0 \\ 0 & 0 & 0 & q_1-q_2 & 0 & 0 \\ 0 & 0 & 0 & 0 & q_1-q_2 & 0 \\ 0 & 0 & 0 & 0 & 0 & q_1-q_2 \end{vmatrix} \quad (13)$$

In the following considerations, the laser beam is restricted to an incidence normal to the plane the pixels are written, so that the stress optic matrix $q_{ij}$ equation 12 can be finally presented in the form:

$$q = \begin{vmatrix} q_1 & q_2 & 0 \\ q_2 & q_1 & 0 \\ 0 & 0 & q_1-q_2 \end{vmatrix} \quad (14)$$

The generalized Hooke's law in a 2D approximation (cf. equation 1 of the U.S. 61/363,352) gives for the induced change of the impermeability $\Delta\beta_{ij}$:

$$\Delta\beta_{ij} = \sum_{k=1,l=1,m=1,n=1}^{2,2,2,2} q_{ijkl}H_{klmn}\varepsilon_{mn} \quad (15)$$

For the following considerations the resulting change of the refractive index and the orientation of the principal optical axes have to be known. It is generally known that for nonmagnetic materials the impermeability is the inverse square of the refractive index:

$$n^{-2} = \beta = \beta_0 + \Delta\beta = n_0^{-2} + \Delta\beta \quad (16)$$

When considering an initial isotropy of the transparent material, the refractive index $n_0$ can be treated as a scalar and it can be assumed that the induced perturbation $\Delta\beta$ is small compared to $n_0$, i.e. $\|n_0^2\Delta\beta\| \ll 1$. When this condition is fulfilled, the equation 16 can be rewritten in the form:

$$n = n_0 + \Delta n = (n_0^{-2} + \Delta\beta)^{-1/2} = n_0\left(1 - \frac{n_0^2\Delta\beta}{2}\right) = n_0 - \frac{1}{2}n_0^3\Delta\beta \quad (17)$$

with $$\Delta n = -\frac{1}{2}n_0^3\Delta\beta \quad (18)$$

With the aid of the equation 18 for the induced change of the refractive index it is possible to express the dependence of the optical retardation from parameters of the laser beam used for the writing of the pixels in a calibration experiment. For the derivation of the following equations, it is utilized that the deformation model is a 2D model and that one principal optical axis is directed in z direction, which is the direction of the laser beam 135. In the plane normal to the z direction, which is the plane in which the pixels are written, the principal optical axes are rotated by an angle γ:

$$\gamma = \frac{1}{2}tg^{-1}\left(\frac{2\beta_{12}}{\beta_{11}-\beta_{22}}\right) \quad (19)$$

where $tg^{-1}$ is the inverse function of tan and where $\beta_{ij}$ are the components of the impermeability matrix of equation 15. The magnitude of the retardation difference ΔR is:

$$\Delta R = dn_0^3\sqrt{\left(\frac{\beta_{11}-\beta_{22}}{2}\right)^2 + \beta_{12}^2} \quad (20)$$

where d is the thickness of the transparent material, which is for example a mask blank.

The equations 15, 17, 18 and 19 provide the ability to compute the orientation of the principal optical axes and the magnitude of the retardation difference when the mode signature and the writing map are known. Principally, this information is sufficient to reconstruct the components l of the mode m of the mode signature $t_l^m$ from the experimental measurements of the retardation. However, the problem will now be transformed in order to make it more symmetric. It is assumed that measurements of the birefringence are available at a set of the locations. In the next step, the pair angle and the magnitude are converted for every cell α to the Jones' matrix:

$$R^\alpha = \begin{vmatrix} R_a^\alpha & R_b^\alpha \\ R_b^\alpha & -R_a^\alpha \end{vmatrix} \quad (21)$$

with $$R_a^\alpha = i\Delta R^\alpha \cos(2\gamma)$$
$$R_b^\alpha = i\Delta R^\alpha \sin(2\gamma) \quad (22)$$

A measured pair of retardation differences in the principal axes and the angle of the orientation of the principal axes is called a birefringence measurement (BF). If the pair is $R_a$ and $R_b$, the measurement is denoted as retardations. It is now assumed that the induced retardation change is additive to the retardation induced by the initial transparent material prior to the writing of the calibration pixels. In order to compute a birefringence change, it is necessary to subtract the initial retardation from the retardation resulting from the writing of the calibration pixel and to convert the difference to a birefringence change.

The birefringence is measured for a set of locations $X_j, Y_j$, $j=1, \ldots, L$. Consequently, the retardations are only known at these nodes. Similar to the first example discussed above, it is now assumed that the deformations act linearly within an elementary area of the grid. Then, a matrix can be generated which transforms magnitudes of the retardations $R^a$ and $R^b$ at the nodes $\alpha$ to the retardations at the desired locations i by using the functions defined in equation 14 of the U.S. 61/363,352. In order to execute this transformation, the global counting of the parameters of Jones' matrix is introduced here:

$$R_{2i} = R_a^i, R_{2i+1} = R_b^i \tag{23}$$

It is now possible to construct a transformation matrix of retardations at the grid nodes j to retardation values at the desired locations i:

$$\rho_i = \sum_{j=1}^{2 \cdot (M+1) \cdot (M+1)} M_{ij} R_j \tag{24}$$

In equation 24 $\rho_i$ is the result of a linear interpolation of computed retardations at the locations $X_i$, $Y_i$. The transformation matrix $M_{ij}$ has a dimension of $L \times 2 \cdot (M+1) \cdot (M+1)$, but actually has only eight diagonal elements, because every location is interpolated using only four corners of the respective element.

By combining equations 1, 15, 18, 19, 20, and 24, the retardation $\rho_n$ is obtained in the form:

(equation 25)
$$\rho_n = dn_0^3 \sum_{i=1,j=1,r=1,q=1,p=1,o=1,k=1,\alpha=1,l=1,m=1}^{2(M+1)^2, 2 \cdot (M+1)^2, 2 \cdot (M+1)^2, 3 \cdot (M+1)^2, 3 \cdot (M+1)^2, 8, M^2, 5, R}$$
$$M_{nr} d_{rq} q_{qp} H_{po} A_{oi} P_{ij}^{g^{-1}} P_{jk\alpha}^{w} a_m^\alpha N_{kl} t_l^m$$

The matrix $A_{oi}$ is a discrete representation of the operator A of the equation 9 operating at node i, the matrix $H_{po}$ is the direct product of the matrix $H_{ij}$ (elasticity tensor) having a dimension of 3×3 and of the unit matrix E with a dimension of $(2 \cdot (M+1)^2) \times (2 \cdot (M+1)^2)$:

$$H_{po} = H_{ij} \times E = H_{ij} \times \begin{pmatrix} 1 & & & \\ & 1 & & \\ & & \ldots & \\ & & & 1 \end{pmatrix} = \begin{pmatrix} H_{ij} & & & \\ & H_{ij} & & \\ & & \ldots & \\ & & & H_{ij} \end{pmatrix} \tag{26}$$

wherein the number of diagonal elements in the unit matrix E is $2 \cdot (M+1)^2$. The matrix $q_{rp}$ is the direct product of the matrix $q_{ij}$ having a dimension of 3×3, and of the unity matrix E similar to the equation 26:

$$q_{pq} = q_{ij} \times E = q_{ij} \times \begin{pmatrix} 1 & & & \\ & 1 & & \\ & & \ldots & \\ & & & 1 \end{pmatrix} = \begin{pmatrix} q_{ij} & & & \\ & q_{ij} & & \\ & & \ldots & \\ & & & q_{ij} \end{pmatrix} \tag{27}$$

Furthermore, parallel to equations 26 and 27 the matrix $d_{rq}$ is a direct multiplication of the matrix $d_{ij}$ having a dimension of 3×2:

$$d_{ij} = \begin{Bmatrix} 1 & -1 & 0 \\ 0 & 0 & 1 \end{Bmatrix}$$

and the unity matrix E wherein $d_{ij}$ is a transformation matrix transforming the 2D engineering notation in the three-dimensional vector notation.

As in the first example, it is also the target for this second example of the inventive method to define the components l of a mode signature $t_l^m$ for the writing mode m by the writing of pixels in a calibration experiment and by measuring the retardation change induced in the transparent material by the pixels. It will now be shown how an experiment can be designed which allows the determination of the components of the mode signature of one mode m via BF (birefringence) measurements. For this example, the calibration measurement will be called a mode signature determination experiment (MSD experiment).

Again, similar to the first example for the determination of the at least one unknown laser beam parameter, the mode signatures $t_l^m$ for the different sets m of the laser beam parameters or for all writing modes m can be determined by repeating the MSD experiment R-times, since m runs from 1 to R.

A test mask blank without an absorber coating is used for the execution of the MSD experiment. In the first step, the initial state of the birefringence of the mask blank is measured, i.e. the state of the transparent material prior to the writing of pixels in the material. Similar to the first example, only one writing mode m is used to write pixels in only a portion of the mask blank. The reasons for this approach are identical to the reasons for the first example, which have been discussed above. In order to improve the accuracy of the MSD (mode signature determination) experiment, pixels are again written according to a regular grid and the writing density is kept constant in every cell of the portion of the mask blank into which pixels are introduced. Furthermore, also for simplicity reasons, a single constant writing density amplitude is used in the MSD experiment. These assumptions do not affect the complexity of the computation, but only simplify the writing process. On the other hand, these assumptions mean that in equation 25 all components of the writing density amplitudes $a_m^\alpha$ are known and the resulting retardation change of equation 25 can now be expressed as:

$$\rho_n = \sum_{l=1}^{5} R_{nl} t_l^m \tag{28}$$

The measured retardation change can be qualified as $\theta_n$. The MSD experiment has the target to determine the components l of the mode signature $t_l^m$ for the writing mode m which give the best match of the simulated retardation $\rho_n$ to the measured retardation changes $\theta_n$. This optimization task is achieved by the following target functional:

$$\min\left\{ \sum_{n=1}^{N} (\theta_n - \rho_n)^2 \right\} \tag{29}$$

where N has to fulfil the constraint discussed in the context of equation 5.

The target functional of equation 29 does not require a Tikhonov regularization. The equation 29 can be solved for the mode signature which leads to:

$$t^m = (R^T R)^{-1} R^T \theta \tag{30}$$

The effectiveness of the discussed MSD experiment will now be demonstrated. As already mentioned above, a mask blank without a coating will be used as the transparent material for the MSD experiment. In a first step, the initial birefringence of the mask blank is measured.

Figure 7:
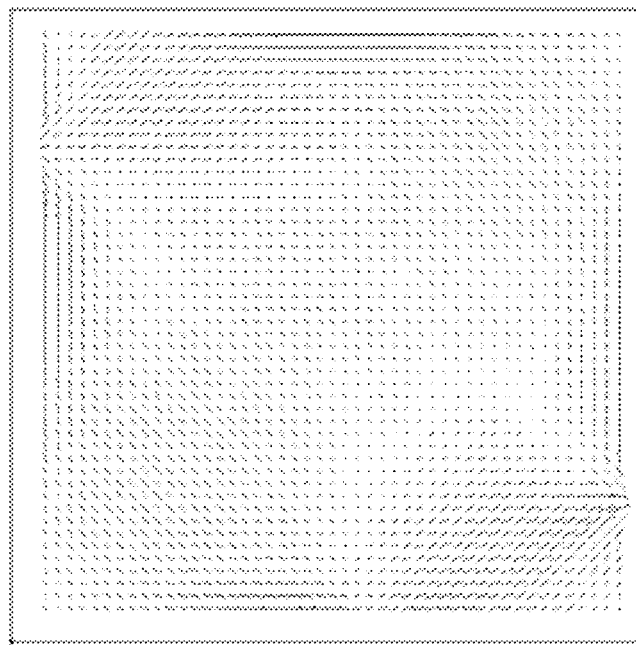
FIG. 7 schematically shows the initial birefringence of a mask blank used as a transparent material.

FIG. 7 shows the initial birefringence of the mask blank used as the transparent material in the MSD experiment. The bars at the outer edges of the mask blank of FIG. 7 indicate the orientation of the fast axis and the length of the bars represents the magnitude or the amount of the birefringence. The variation of the birefringence measurements induced by the chuck 120 of the apparatus 100 used to fix the transparent material 110 which is in this example a mask blank can be observed on the upper part of the left side and on the lower part of the right side of the mask blank. At a later stage, this initial birefringence value will be subtracted from the measured birefringence after the pixels have been written in the mask blank. It is clear from FIG. 7 that the initial contribution has to be reduced in order to improve the accuracy of the MSD experiment.

Figure 8:
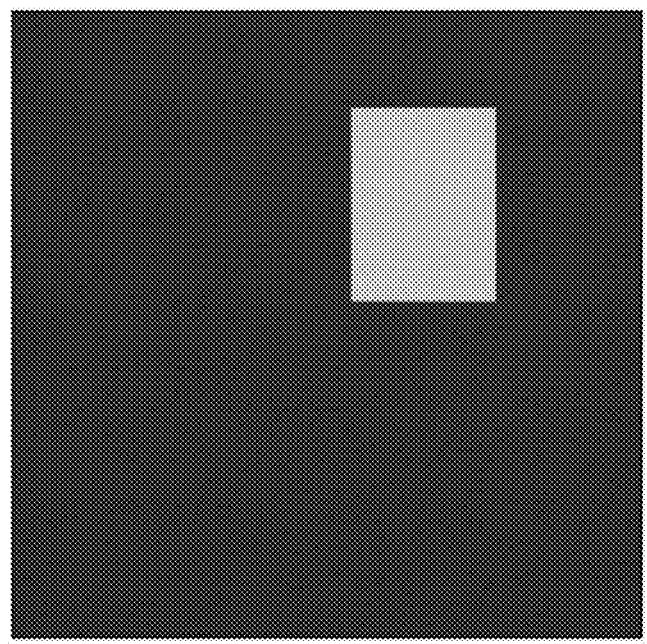
FIG. 8 depicts the writing map for a MSD (mode signature determination) experiment for the mask blank of FIG. 7.

FIG. 8 presents the writing map for the MSD experiment. Similar to the first example presented above, a quarter of the mask blank is selected for the writing of the pixels in the MSD experiment. Further, also analogue to the calibration experiment in the first example, pixels are written with a constant writing density across the portion of the mask blank. The grey square of FIG. 8 indicates the area with the constant writing density. The overall area of the substrate of the photolithographic mask was 152 mm×152 mm and the selected portion of the mask substrate has dimensions of 35 mm×47 mm. This selection of the writing map saves mask area as a mask blank can be used for four MSD experiments in a single writing layer within the mask.

Figure 9:
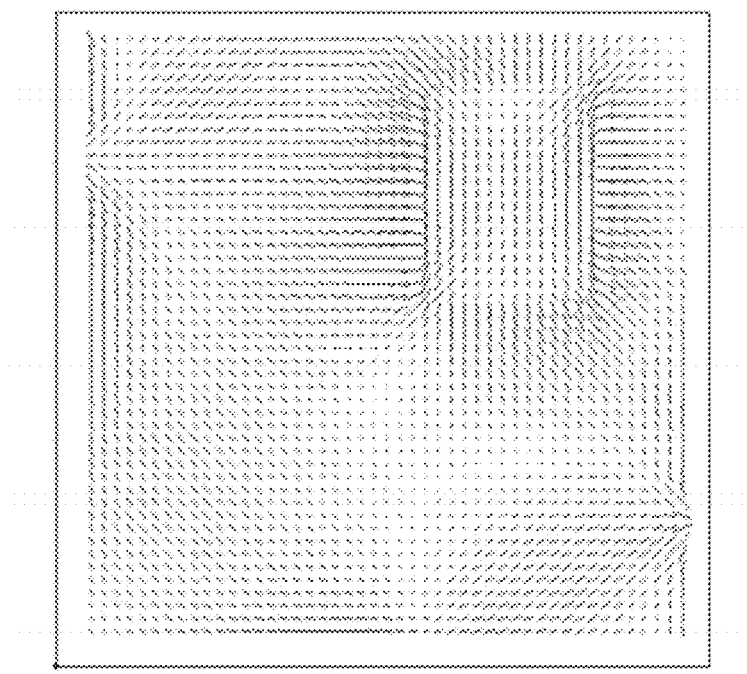
FIG. 9 schematically presents the measured birefringence after pixels have been written in a mask blank according to the MSD experiment of FIG. 8.
Figure 10:
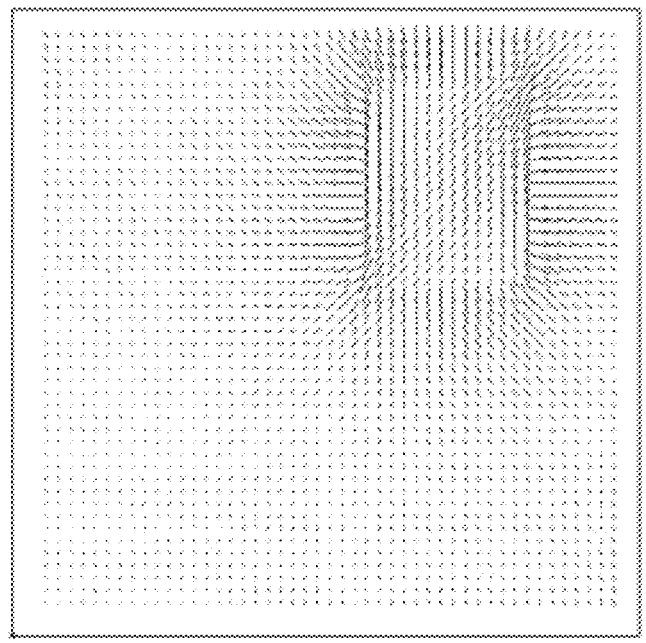
FIG. 10 shows the differences of the birefringence of FIG. 9 and FIG. 7, i.e. the retardations induced by the MSD experiment of FIG. 8.

FIG. 9 depicts the measurement of the birefringence resulting from the writing of pixels in a portion of the mask blank according to the MSD experiment presented in FIG. 8. FIG. 10 presents the retardations induced by the writing of pixels in the grey area of FIG. 8, i.e., the initial birefringence of the mask blank as shown in FIG. 7 is subtracted from the measured birefringence after performing the writing of pixels in the context of a MSD experiment.

The birefringence is measured by the analysis of the change of a property of the laser beam when passing through the mask blank. The numerical values of the retardation actually measured are very small and are in the range of some nanometers. This is an extremely small value, and thus it is difficult to measure this quantity. Additionally, in the portion of the mask blank where pixels have been written in the course of the MSD experiment, the laser beam used to analyze the induced retardations experiences some scattering at the induced pixels which affects the measurement of the retardations induced by the pixels. Therefore, the portion into which the laser source 130 writes pixels (the grey area in FIG. 8) has to be excluded from the analysis of the retardations induced by the birefringence.

For the birefringence measurements a laser system different of the lasers system 100 of FIG. 1 is used. An Exicor MT device designed by the Hinds company is used for the birefringence measurements. As already mentioned above, this apparatus measures the light beam after its passage through the transparent material. Alternatively, the inventive method also allows measuring of the light beam reflected from a surface of the transparent material, i.e., the application of an ellipsometer. However, at the moment ellipsometers do not have the resolution required for a MSD experiment.

Figure 12:
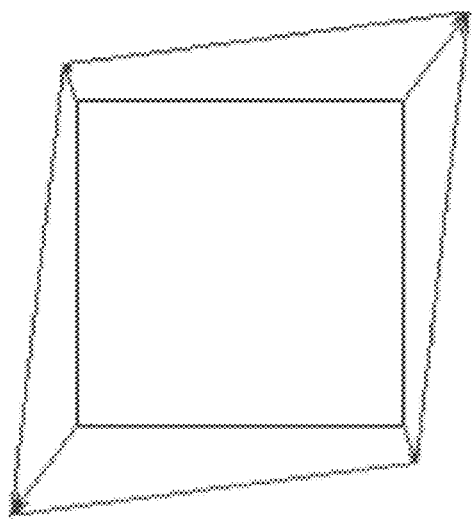
FIG. 12 schematically depicts the computed components values of the mode signature $t_l{}^m$.

FIG. 12 graphically presents the computed numerical values of the components of the mode signature. Similar to FIG. 4, the black square shows a non deformed elementary area or a cell in the plane of the induced pixels within the transparent material 110 prior to the writing of pixels. The red rhomboid presents the deformed elementary area after performing the MSD experiment of FIG. 8. The area of the red rhomboid is clearly larger than the area of the black square; this indicates that the writing of the pixels locally expands the transparent material which induces a local reduction of its density. The asymmetry in the red rhomboid compared with the black square reflects the asymmetry of the deformation induced by the laser beam in its focal point.

The numerical values of the components l of the mode m of the mode signature $t'^m_l$ are obtained from equation 29. For the construction of the red rhomboid the determined values $t'^m_l$ are taken and linear combinations according to $$\sum_{j=1}^{5} N_{ij} t'^m_j$$

(multiplied with some constants) are again added to the coordinates of the corners of the not deformed cell.

Figure 13:
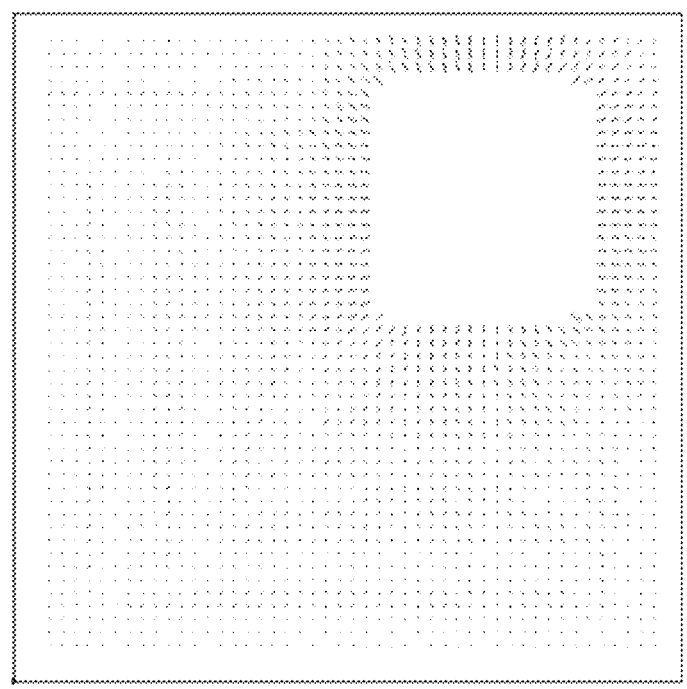
FIG. 13 schematically shows the simulated birefringence variation induced by the writing map of FIG. 8.

The accuracy of the described mode signature determination is estimated by simulating the birefringence variation according to equation 28 and using the determined component values of the mode signature $t'^m_l$. FIG. 13 shows a graph of the computed birefringence change.

Figure 11:
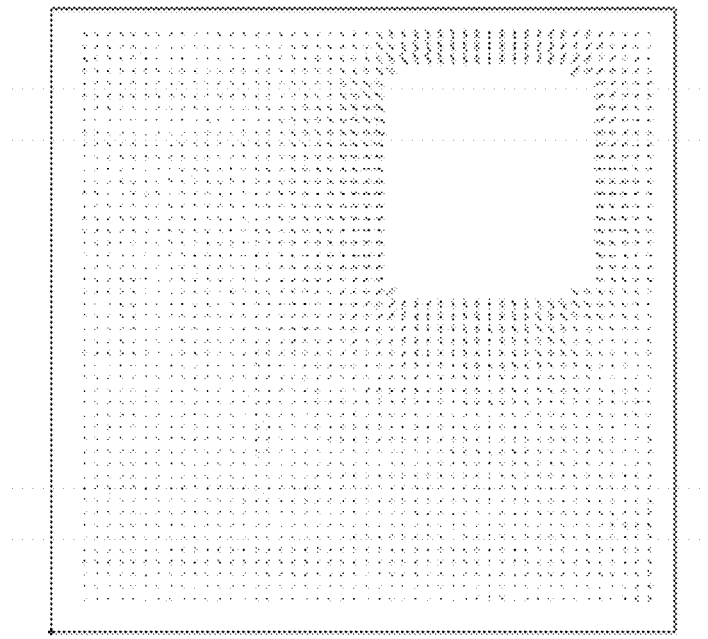
FIG. 11 shows FIG. 10 where the portion of the mask blank of FIG. 8 (the portion into which pixels have been written) is excluded from the analysis of the induced birefringence.
Figure 14:
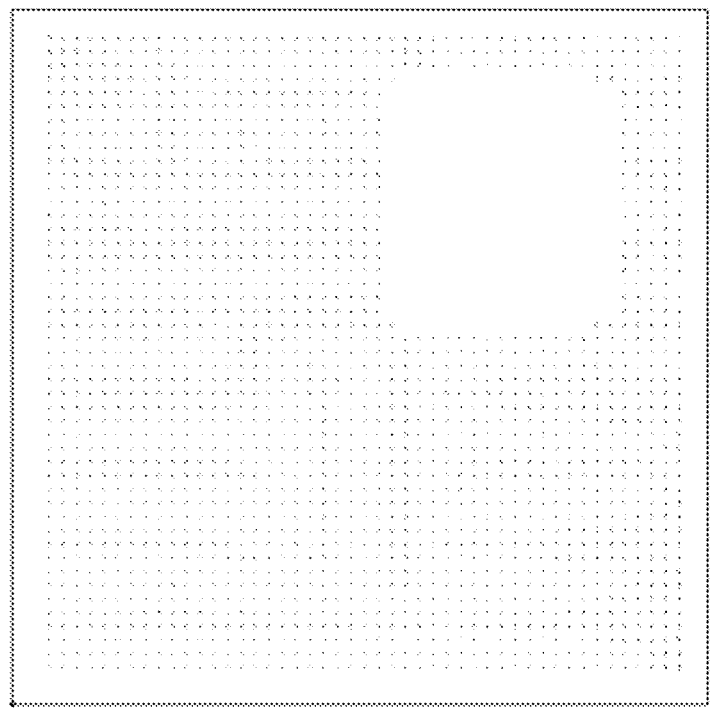
FIG. 14 schematically indicates the differences between the measured (FIG. 11) and the simulated birefringence variation (FIG. 13).

Finally, FIG. 14 represents the residual birefringence difference of the measured (FIG. 11) and the simulated birefringence variation. FIG. 14 clearly demonstrates that the MSD experiment does not contain any systematic error. Similar to the first example, the remaining difference is most probably resulting from the measurement noise and from the instability of the laser beam 135 of the laser source 130 used for the writing of the pixels into the transparent material 110, which is in this example a mask blank.

The mean square difference of the measured and simulated retardation change is 0.1 nm/cm and $R^2=0.98$ which proves the very high certainty of the mode signature determination.

As a consequence of the fact that the tool signature does not significantly depend on the depth in the mask blank into which pixels are written and due to the good additivity of the induced retardation changes, the same mask blank can be used for another series of MSD experiments. The MSD pixels are written in an adjacent layer, wherein the different layers are separated in the direction of the laser beam by a distance which is larger than the size of the pixel in the beam direction. The limitations of using different layers in various depths of the mask blank are above explained in the context of the discussion of the first example.

Both discussed examples clearly demonstrate that they are well suited to determine the at least one unknown laser beam parameter. After fixing of this laser beam parameter, the deformation model can be used to control the laser beam 135 of the laser source 130 of the apparatus 100 to correct errors of transparent materials 110.

What is claimed:

1. A method for determining at least one unknown laser beam parameter of a laser beam used for correcting registration errors of a photolithographic mask, the method comprising:

a. inducing a first persistent modification in a substrate in the photolithographic mask by an interaction of the substrate of the photolithographic mask with the laser beam having a first set of laser beam parameters, wherein the first persistent modification introduces a local density variation in the substrate of the photolithographic mask;

b. measuring the first persistent modification induced in the substrate of the photolithographic mask;

c. calculating a second persistent modification in the substrate of the photolithographic mask using a deformation model describing persistent modifications that introduce local density variations in the substrate of the photolithographic mask with a second set of laser beam parameters, wherein the first set of laser beam parameters comprises the second set of laser beam parameters and the at least one unknown laser beam parameter;

d. setting up a target functional comprising the first persistent modification induced in the substrate of the photolithographic mask and the second persistent modification;

e. determining the at least one unknown laser beam parameter by minimizing the target functional; and f. after determining the at least one unknown laser beam parameter, using the deformation model to control the laser beam to correct registration errors of one or more photolithographic masks.

2. The method according to claim 1, wherein a Lagrange variational principle is used to set-up the target functional.

3. The method according to claim 2, wherein the target functional minimizes a difference between the first persistent modification and the second persistent modification calculated by using the Lagrange variational principle.

4. The method according to claim 1, wherein the first persistent modification is induced in a portion of the photolithographic mask and the induced first persistent modification is measured across an overall area of the photolithographic mask and wherein the second persistent modification is calculated across the overall area.

5. The method according to claim 1, wherein the second set of laser beam parameters determines a writing density amplitude and a writing density which are model parameters.

6. The method according to claim 1, wherein the at least one unknown laser beam parameter comprises components of a deformation element in the photolithographic mask in a normal direction perpendicular to the laser beam.

7. The method according to claim 6, wherein the writing density amplitude and the writing density are constant across the photolithographic mask during determining the at least one laser beam parameter.

8. The method according to claim 1, wherein the first persistent modification comprises a density variation of the photolithographic mask, and/or wherein one set m of the second set of laser beam parameters results in a calculated displacement $\zeta_i$ at the location i as a function of the components of the deformation element $t_l^m$ in at least one normal direction l is given by $$\xi_i = \sum_l R_{il} t_l^m,$$

where $R_{ij}$ is $$R_{il} = \sum_{njk} M_{in}(P_{nj}^g)^{-1} P_{jk}^w a_m N_{kl},$$

wherein the tensor $(P_{nj}^g)^{-1}$ is the inverse tensor of a potential energy distribution in an initial state of the photolithographic mask and $P_{jk}^w$ is an element of the tensor describing the potential energy distribution after introducing the first density variation in the photolithographic mask, both tensors comprise material parameters of the photolithographic mask, and $N_{kl}$ is a normalization tensor.

9. The method according to claim 8, wherein the induced first persistent modification is a density variation measured as a difference of a displacement $\phi_n$ of a location n relative to the location n prior to inducing the first persistent modification, and/or wherein the target functional is of the form $$\min\left\{\sum_n (\varphi_n - \zeta_n)^2\right\}.$$

10. The method according to claim 1, wherein the persistent modification comprises a density variation of the photolithographic mask and the induced variation of a refraction index in the photolithographic mask is used for determining of the at least one laser beam parameter, and/or wherein one set m of laser beam parameters results in a calculated retardation $\rho_n$ at the location n as a function of the components of the deformation element $t_l^m$ in at least one normal direction l, $$\rho_n = d \cdot n_0^2 \sum_{ijrpokl} M_{nr} d_{rq} q_{qp} H_{po} A_{oi}(P_{ij}^g)^{-1} P_{jk}^w a_m N_k^l t_l^m$$

where d is the thickness of the photolithographic mask, $n_o$ is the refraction index, $M_{nr}$ denotes a transform matrix which transforms the retardations at the grid nodes to a retardation $\rho_n$ at an arbitrary location n, $d_{rq}$ is the direct product of the matrix $$d = \begin{Bmatrix} 1 & -1 & 0 \\ 0 & 0 & 1 \end{Bmatrix}$$

with a unity matrix having a dimension of $(2\cdot(M+1)^2)*(2\cdot(M+1)^2)$, $q_{qp}$ stands for the direct product of the optic stress matrix in a two-dimensional approximation with the unity matrix having the dimension of $(2\cdot(M+1)^2)*(2\cdot(M+1)^2)$, $H_{po}$ is the direct product of the elasticity tensor in a two-dimensional approximation with the unity matrix having the dimension of $(2\cdot(M+1)^2)*(2\cdot(M+1)^2)$, the matrix operator $A_{oi}$ describes the partial derivatives of the two-dimensional displacement field, the tensor $(P_{nj}^g)^{-1}$ is the inverse tensor of a potential energy distribution in an initial state of the photolithographic mask and $P_{jk}^w$ is an element of the tensor describing the potential energy distribution after introducing the first density variation in the photolithographic mask, both tensors comprise material parameters of the photolithographic mask, and $N_{kl}$ is a normalization tensor.

11. The method according to claim 10, wherein the induced retardation variation is measured as a difference between the retardation $\theta_n$ of a location n prior to inducing the first persistent modification and after inducing the first persistent modification with the first set of the laser beam parameters, and/or wherein the target functional is of the form $$\min\left\{\sum_n (\theta_n - \rho_n)^2\right\}.$$

12. The method according to claim 1, wherein the photolithographic mask comprises a substrate of at least one of a transmissive or a reflective photolithographic mask.

\* \* \* \* \*

UNITED STATES PATENT AND TRADEMARK OFFICE
CERTIFICATE OF CORRECTION

PATENT NO. : 9,753,366 B2
APPLICATION NO. : 13/252480
DATED : September 5, 2017
INVENTOR(S) : Vladimir Dmitriev Page 1 of 1

It is certified that error appears in the above-identified patent and that said Letters Patent is hereby corrected as shown below:

Page 2

Column 2 (Other Publications), Line 23, delete "DIV Attenuating Structures" and insert -- DUV Attenuating Structures --

Column 2 (Other Publications), Line 42, delete "EUV Lithograpy," and insert -- EUV Lithography, --

Column 4

Line 60, delete "
$$\rho_n = d \cdot n_0^3 \sum_{ijrpokl} M_{nr} \mathbf{d}_{rq} \mathbf{q}_{pq} \mathbf{H}_{po} A_{oi} (P_{ij}^g)^{-1} P_{jk}^w a_m N_k^l t_l^m$$
"

and insert --
$$\rho_n = d \cdot n_0^3 \sum_{ijrpokl} M_{nr} \mathbf{d}_{rq} \mathbf{q}_{qp} \mathbf{H}_{po} A_{oi} (P_{ij}^g)^{-1} P_{jk}^w a_m N_k^l t_l^m$$
--

Column 20

In Claim 10, Line 31 (approx.), delete "
$$\rho_n = d \cdot n_0^2 \sum_{ijrpokl} M_{nr} \mathbf{d}_{rq} \mathbf{q}_{qp} \mathbf{H}_{po} A_{oi} (P_{ij}^g)^{-1} P_{jk}^w a_m N_k^l t_l^m$$
"

and insert --
$$\rho_n = d \cdot n_0^3 \sum_{ijrpokl} M_{nr} \mathbf{d}_{rq} \mathbf{q}_{qp} \mathbf{H}_{po} A_{oi} (P_{ij}^g)^{-1} P_{jk}^w a_m N_k^l t_l^m$$
--

Signed and Sealed this
Seventh Day of November, 2017

Joseph Matal
*Performing the Functions and Duties of the*
*Under Secretary of Commerce for Intellectual Property and*
*Director of the United States Patent and Trademark Office*